United States Patent
Lin et al.

(10) Patent No.: US 9,520,351 B2
(45) Date of Patent: Dec. 13, 2016

(54) PACKAGING SUBSTRATE AND PACKAGE STRUCTURE

(71) Applicant: Siliconware Precision Industries Co., Ltd., Taichung (TW)

(72) Inventors: Chang-Fu Lin, Taichung (TW); Chin-Tsai Yao, Taichung (TW); Ming-Chin Chuang, Taichung (TW); Ko-Cheng Liu, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 2 days.

(21) Appl. No.: 14/564,145

(22) Filed: Dec. 9, 2014

(65) Prior Publication Data
US 2015/0332998 A1    Nov. 19, 2015

(30) Foreign Application Priority Data
May 19, 2014 (TW) .............................. 103117461 A

(51) Int. Cl.
*H01L 23/00* (2006.01)
*H01L 23/498* (2006.01)
*H05K 1/02* (2006.01)
*H01L 23/31* (2006.01)

(52) U.S. Cl.
CPC ... *H01L 23/49822* (2013.01); *H01L 23/49838* (2013.01); *H05K 1/0298* (2013.01); *H01L 23/3121* (2013.01); *H01L 2224/16225* (2013.01); *H01L 2224/32225* (2013.01); *H01L 2224/73204* (2013.01); *H01L 2924/15174* (2013.01); *H01L 2924/181* (2013.01); *H05K 2201/0191* (2013.01); *H05K 2201/0195* (2013.01)

(58) Field of Classification Search
CPC .................................................. H01L 23/49833
See application file for complete search history.

(56) References Cited

U.S. PATENT DOCUMENTS

| | | | | |
|---|---|---|---|---|
| 8,609,997 B2* | 12/2013 | Shomura | ............... | H05K 3/4602 174/260 |
| 2011/0000706 A1* | 1/2011 | Shomura | ............... | H05K 3/4602 174/262 |

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A packaging substrate and a package structure are provided. The packaging substrate includes a plurality of dielectric layers, two of which have a difference in thickness; and a plurality of circuit layers alternately stacked with the dielectric layers. Therefore, the package warpage encountered in the prior art is avoided.

36 Claims, 4 Drawing Sheets

PACKAGING SUBSTRATE AND PACKAGE STRUCTURE

CROSS-REFERENCES TO RELATED APPLICATIONS

This application claims under 35 U.S.C. §119(a) the benefit of Taiwanese Application No. 103117461, filed May 19, 2014, the entire contents of which is incorporated herein by reference.

BACKGROUND OF THE INVENTION

1. Field of the Invention

The present invention relates to packaging substrates and package structures, and, more particularly, to a packaging substrate and a package structure having a plurality of stacked dielectric layers and circuit layers.

2. Description of Related Art

Flip-chip technologies facilitate to reduce chip package area, signal path and so on, and therefore have been widely used for chip packaging, such as chip scale package (CSP) and multi-chip module (MCM).

FIG. 1 is a cross-sectional view of a conventional flip-chip 1 substrate. Referring to FIG. 1, the substrate 1 has a plurality of dielectric layers 11 and a plurality circuit layers 12 alternately stacked with each dielectric layers 11. If each dielectric layer 11 in a packaging substrate 1 that has four dielectric layers 11 is 40 μm thick, a thickness sum of the four dielectric layers 11 is 160 μm.

However, during a temperature cycle test of a flip-chip packaging process, warpage easily occurs to the package substrate due to a big CTE (Coefficient of Thermal Expansion) mismatch between the chip and the package substrate, a surface area of the packaging substrate being too large, or asymmetrical heating. Consequently, it becomes difficult to form good joints between conductive bumps around an outer periphery of the chip and contacts of the package substrate, thereby reducing the product yield.

The warpage problem may be alleviated by increasing the thickness of the dielectric layer, which, however, also increases the overall thickness of the packaging substrate and unable to meet the low-profiled, compact-sized requirements.

Accordingly, there is an urgent need to solve the drawbacks encountered in the prior art.

SUMMARY OF THE INVENTION

In view of the foregoing problems, the present invention provides a packaging substrate, comprising: a plurality of dielectric layers, at least two of which having a difference in thickness; and a plurality of circuit layers alternately stacked with the dielectric layers.

The present invention further provides a package structure, comprising: a packaging substrate having a plurality of dielectric layers and a plurality of circuits layers alternately stacked with the dielectric layers, wherein at least two of the dielectric layers have a difference in thickness; and a chip mounted on a first surface of the packaging substrate.

In an embodiment, the packaging substrate further comprises a first surface and a second surface opposing the first surface, wherein one of the dielectric layers that is disposed on or close to the first surface is thicker than another one of the dielectric layers that is disposed on or close to the second surface; the first surface is a chip mounting side, and the second surface is a non-chip mounting side; one of the dielectric layers that is closest to the first surface has a thickness greater than each of thicknesses of the others of the dielectric layers, and one of the dielectric layers that is closest to the second surface has a thickness less than each of thicknesses of the others of the dielectric layers; and the dielectric layers, except the one that is closest to the first surface and the one that is closest to the second surface, have the same thickness.

In an embodiment, the thicknesses of the dielectric layers gradually decrease from the from the first surface to the second surface; and the sum of the thickness of half of the dielectric layers that are close to the first surface is greater than the sum of the thickness of the other half of the dielectric layers that are close to the second surface.

In an embodiment, a thickness ratio between a thickest one of the dielectric layers and a thinnest one of the dielectric layers is 1.2:1 to 2:1, preferably 1.5:1.

In an embodiment, a thickest dielectric layer and the thinnest dielectric layers have a thickness difference of 50 μm, preferably 10 μm to 25 μm.

In an embodiment, the number of the dielectric layers is even or odd; a core layer is disposed therebetween, and the dielectric layers are symmetrically distributed on two opposing surfaces of the core layer with the core layer as a center.

Therefore, by providing a thickness difference between the dielectric layers, the present invention increases the rigidity of the package substrate so as to reduce warpage of the package substrate. Further, the sum of the thicknesses of the dielectric layers s can be kept unchanged so as not to increase the overall thickness of the package substrate and structure.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

Figure 1:
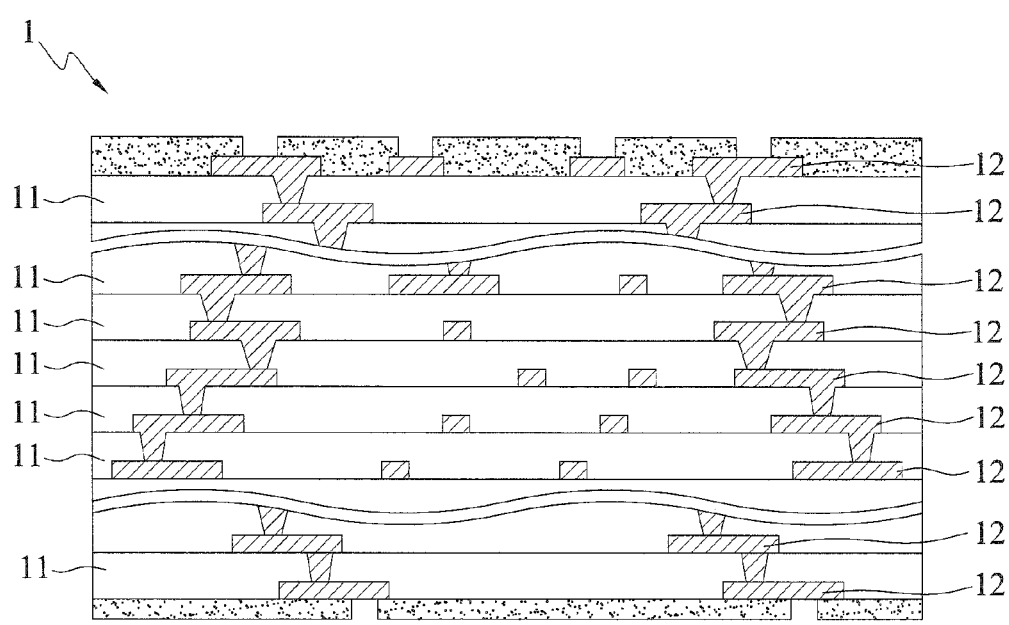
FIG. 1 is a cross-sectional view of a conventional flip-chip packaging substrate.
Figure 2:
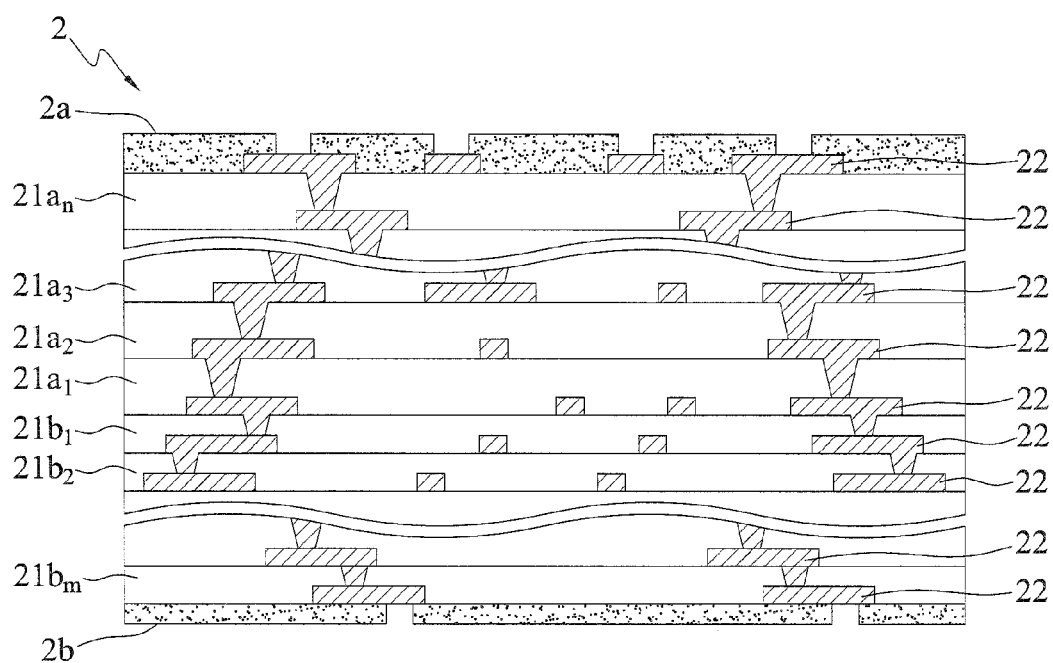
FIG. 2 is a cross-sectional view of a packaging substrate in accordance with an embodiment of the present invention.

Referring to FIG. 2, a cross-sectional view of a packaging substrate 2 in accordance with an embodiment of the present invention is shown. The packaging substrate 2 comprises: dielectric layers $21a_n$, dielectric layers $21b_m$ and a plurality of circuit layers 22 respectively alternately stacked with the dielectric layers $21a_n$ and the dielectric layers $21b_m$. There is a difference in thickness between one of the dielectric layers $21a_n$ and one of the dielectric layers $21b_m$.

The packaging substrate 2 has a first surface 2a (referred as to an upper surface) and a second surface 2b (referred as to a lower surface). The first surface 2a is opposite to the second surface 2b. The subscripts "n" and "m" in the dielectric layers $21a_n$ and $21b_m$ can be the same or different integers, and can be odd or even numbers. If n=1, the dielectric layers $21a_n$ have only one dielectric layer. If n=2, the dielectric layers $21a_n$ have two dielectric layers. Same rule is applied to the number of layer of the dielectric layers $21b_m$, and therefore will not be described further therein. One of the dielectric layers $21a_n$ disposed on or close to the first surface 2a of the packaging substrate 2 is thicker than another one of the dielectric layers $21b_m$ disposed on or close to the second surface 2b of the packaging substrate 2. The first surface 2a of the packaging substrate 2 is a chip mounting side, and the second surface 2b is a non-chip mounting side, or vice versa.

Under a condition that the total thickness of the dielectric layers $21a_n$ and dielectric layers $21b_m$ is equal to the total thickness of the dielectric layers 11 of the conventional packaging substrate 1, the ratio between the thickest one of the dielectric layers $21a_n$ and the thinnest one of the dielectric layers $21b_m$ is 1.2:1 to 2:1, preferably 1.5:1. The thickest one of the dielectric layers $21a_n$ is thicker than the thinnest one of the dielectric layers $21b_m$ by 10 to 50 μm, preferably 10 to 25 μm. Through increasing the thicknesses of the dielectric layers $21a_n$ while reducing the thicknesses of the dielectric layers $21b_m$, the occurrence of deformation is reduced to 5% to 25%, as compared to the prior art.

In an embodiment, if the total thickness of the dielectric layers $21a_n$ and dielectric layers $21b_m$ equals to the total thickness (e.g., 160 μm) of the dielectric layers 11 of the conventional packaging substrate 1, and the packaging substrate 2 has four dielectric layers (i.e., n=2 and m=2), each of the dielectric layers $21a_n$ is 50 μm thick, and each of the dielectric layers $21b_m$ is 30 μm thick. In other words, the dielectric layers $21a_n$ are thickened, while the dielectric layers $21b_m$ are thinned.

In another embodiment, if the total thickness of the dielectric layers $21a_n$ and dielectric layer $21b_m$ equals to the total thickness (i.e., 160 μm) of the dielectric layers 11 of the conventional packaging substrate 1, and the packaging substrate 2 has four dielectric layers (i.e., n=2 and m=2), the four dielectric layer are 50 μm, 40 μm, 40 μm, and 30 μm thick, respectively. In other words, only the dielectric layer $21a_2$ that is disposed on and closest to the first surface 2a is thickened, and only the dielectric layer $21b_2$ that is disposed on and closest to the second surface 2b is thinned.

In yet another embodiment, if the total thickness of the dielectric layers $21a_n$ and dielectric layers $21b_m$ equals to the total thickness (i.e., 160 μm) of the dielectric layers 11 of the conventional packaging substrate 1, and the packaging substrate 2 has four dielectric layers (i.e., n=2 and m=2), the dielectric layers $21a_1$, the dielectric layers $21a_2$, the dielectric layers $21b_1$, and the dielectric layers $21b_2$ are 50 μm, 45 μm, 35 μm, and 30 μm thick, respectively. In other words, the thicknesses of the dielectric layers $21a_n$ and dielectric layers $21b_m$ are progressively reduced. In yet another embodiment, if the total thickness of the dielectric layers $21a_n$ and dielectric layers $21b_m$ equals to the total thickness (i.e., 160 μm) of the dielectric layers 11 of the conventional packaging substrate 1, and the packaging substrate 2 has four dielectric layers (i.e., n=2 and m=2), the dielectric layers $21a_1$ and the dielectric layers $21a_2$ can have their thicknesses irregularly increased, and the dielectric layers $21b_1$ and the dielectric layers $21b_2$ can have their thicknesses irregularly decreased, while the total thickness of the dielectric layers $21a_1$ and the dielectric layers $21a_2$ is still equal to the total thickness of the dielectric layers $21b_1$ and the dielectric layers $21b_2$. For example, the dielectric layers $21a_1$, the dielectric layers $21a_2$, the dielectric layers $21b_1$, and the dielectric layers $21b_2$ are 50 μm, 45 μm, 25 μm, and 40 μm thick, respectively.

Figure 3:
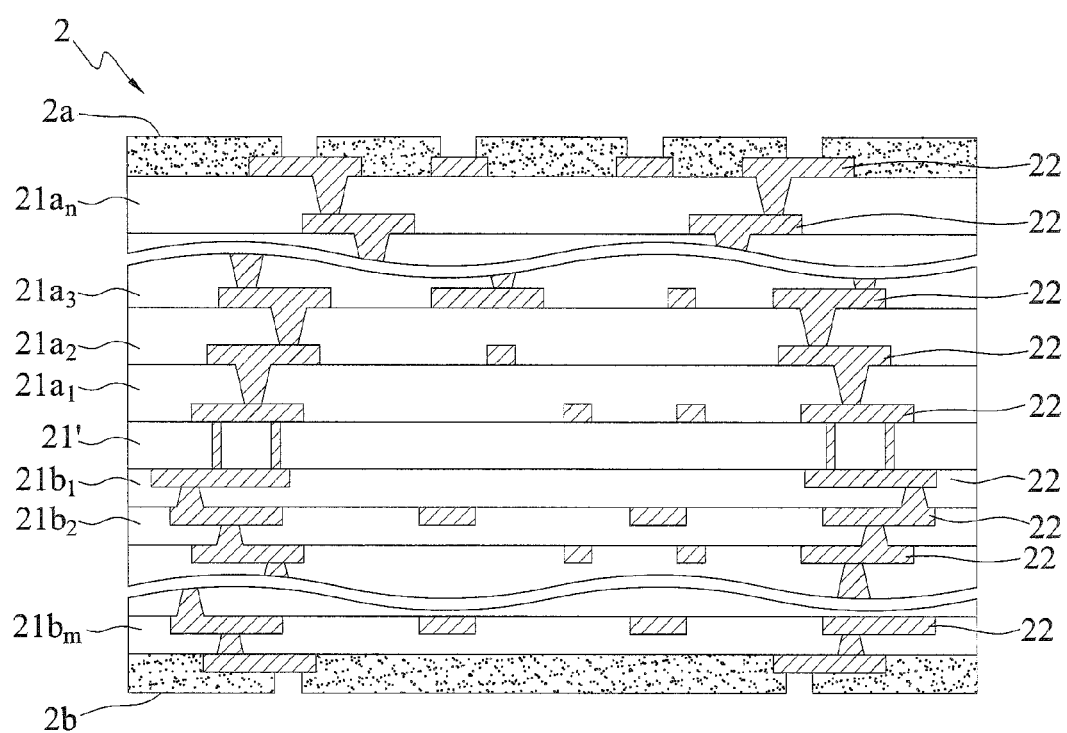
FIG. 3 is a cross-sectional view of a packaging substrate in accordance with another embodiment of the present invention.

FIG. 3 is a cross-sectional view of a packaging substrate 2 in accordance with another embodiment of the present invention. The packaging substrate 2 shown in FIG. 3 differs from the packaging substrate 2 shown in FIG. 2 in that the packaging substrate 2 shown in FIG. 3 has a core board 21' disposed therebetween, and the dielectric layers $21a_n$ and $21b_m$ are symmetrically distributed between two opposing surfaces of the core layer 21', i.e., n=m. The thickness of each of the dielectric layers $21a_n$ and $21b_m$ are modifiable according to the descriptions in FIG. 2. The materials of the core board 21' and the dielectric layers are the same. In another embodiment, the core board 21' is made of glass fiber, epoxy resin, polyimide tape, FR4 resin or BT resin.

Figure 4:
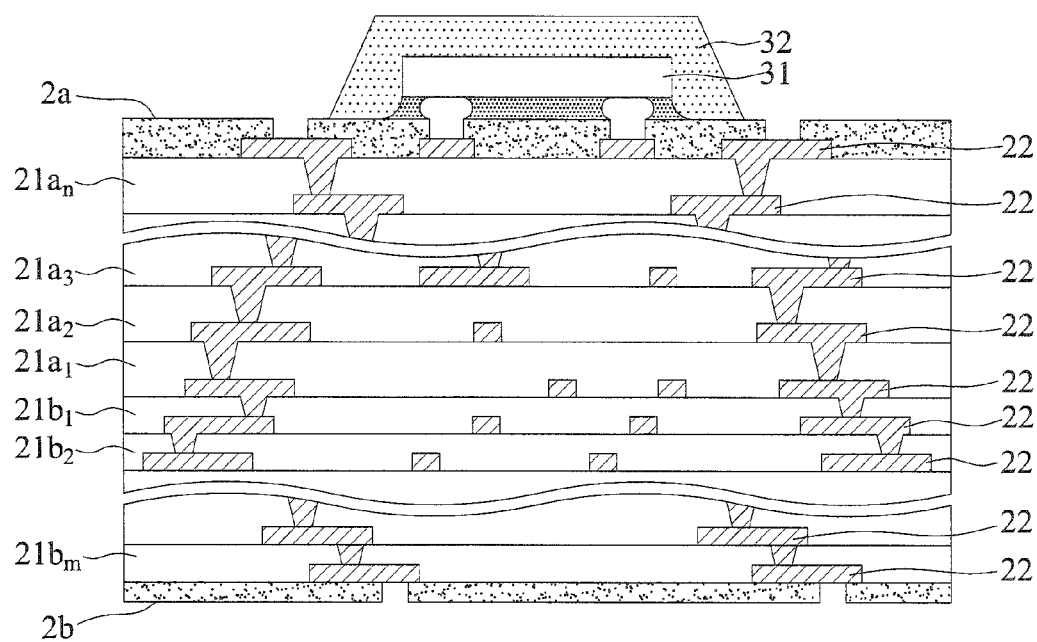
FIG. 4 is a cross-sectional view of a package structure of an embodiment in accordance with the present invention.

FIG. 4 is a cross-sectional view of a package structure in accordance with an embodiment of the present invention. The package structure has a chip 31 mounted on the first surface 2a of the packaging substrate 2, and an encapsulant 32 encapsulating the chip 31. The remaining technical features are similar to that described before, and therefore will not be described in details herein.

In summary, in comparison with the prior art, the present invention provides a solution through adjusting the thickness of parts of the dielectric layers in the package substrate, to increase the overall strength of the substrate in a condition where the total thickness of the dielectric layers of the substrate equals to that of a conventional substrate, thereby preventing the occurrence of substrate warpage (5-25% reduction), therefore increasing the yield of the products. Besides, it should be noted that since not all the dielectric layers are increased in thickness, the total thickness summed up from all the dielectric layers could remain the same, such that the overall thickness is not increased, thus the present invention is able to meet the low-profile requirement nowadays.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A packaging substrate having a first surface and a second surface opposing the first surface, wherein the first surface is a chip mounting side, and the second surface is a non-chip mounting side, comprising: a core layer; a plurality of dielectric layers, at least two of which having a difference in thickness, wherein one of the dielectric layers that is disposed on or close to the first surface in position is greater in thickness than another one of the dielectric layers that is disposed on or close to the second surface in position, and the dielectric layers are symmetrically distributed on two opposing surfaces of the core layer with the core layer as a center; and a plurality of circuit layers alternately stacked with the dielectric layers.

2. The packaging substrate of claim 1, wherein the dielectric layers are reduced progressively in thickness from the first surface to the second surface.

3. The packaging substrate of claim 1, wherein one half of the dielectric layers that are close to the first surface have a thickness sum greater than a thickness sum of the other half of the dielectric layers that are close to the second surface.

4. The packaging substrate of claim 1, wherein a thickness ratio between a thickest one of the dielectric layers and a thinnest one of the dielectric layers is 1.2:1 to 2:1.

5. The packaging substrate of claim 4, wherein a thickness ratio between the thickness one and the thinnest one is 1.5:1.

6. The packaging substrate of claim 1, wherein the thickest dielectric layer and the thinnest dielectric layer have a thickness difference of 10 to 50 μm.

7. The packaging substrate of claim 6, wherein the thickest dielectric layer and the thinnest dielectric layer have a thickness difference of 10 to 25 μm.

8. The packaging substrate of claim 1, wherein the number of the dielectric layers is an even or odd number.

9. A packaging substrate having a first surface and a second surface opposing the first surface, wherein the first surface is a chip mounting side, and the second surface is a non-chip mounting side, comprising: a plurality of dielectric layers, at least two of which having a difference in thickness, wherein one of the dielectric layers that is disposed on or close to the first surface in position is greater in thickness than another one of the dielectric layers that is disposed on or close to the second surface in position, and wherein one of the dielectric layers that is closest to the first surface in position has a thickness greater than each of thicknesses of the others of the dielectric layers, and one of the dielectric layers that is closest to the second surface in position has a thickness less than each of thicknesses of the others of the dielectric layers; and a plurality of circuit layers alternately stacked with the dielectric layers.

10. The packaging substrate of claim 9, wherein the dielectric layers, except the one that is closest to the first surface and the one that is closest to the second surface in position, have the same thickness.

11. The packaging substrate of claim 9, wherein a core layer is disposed therebetween, and the dielectric layers are symmetrically distributed on two opposing surfaces of the core layer with the core layer as a center.

12. The packaging substrate of claim 9, wherein the dielectric layers are reduced progressively in thickness from the first surface to the second surface.

13. The packaging substrate of claim 9, wherein one half of the dielectric layers that are close to the first surface have a thickness sum greater than a thickness sum of the other half of the dielectric layers that are close to the second surface.

14. The packaging substrate of claim 9, wherein a thickness ratio between a thickest one of the dielectric layers and a thinnest one of the dielectric layers is 1.2:1 to 2:1.

15. The packaging substrate of claim 14, wherein a thickness ratio between the thickness one and the thinnest one is 1.5:1.

16. The packaging substrate of claim 9, wherein the thickest dielectric layer and the thinnest dielectric layer have a thickness difference of 10 to 50 μm.

17. The packaging substrate of claim 16, wherein the thickest dielectric layer and the thinnest dielectric layer have a thickness difference of 10 to 25 μm.

18. The packaging substrate of claim 9, wherein the number of the dielectric layers is an even or odd number.

19. A package structure, comprising:
a packaging substrate having a first surface, a second surface opposing the first surface, a core layer, a plurality of dielectric layers, and a plurality of circuit layers alternately stacked with the dielectric layers, wherein at least two of the dielectric layers have a difference in thickness, one of the dielectric layers that is disposed on or close to the first surface in position is greater in thickness than another one of the dielectric layers that is disposed on or close to the second surface in position, and the dielectric layers are symmetrically distributed on two opposing surfaces of the core layer with the core layer as a center; and
a chip mounted on a first surface of the packaging substrate.

20. The package structure of claim 19, wherein the number of the dielectric layers is even or odd.

21. A package structure, comprising:
a packaging substrate having a first surface, a second surface opposing the first surface, a core layer, a plurality of dielectric layers, and a plurality of circuit layers alternately stacked with the dielectric layers, wherein at least two of the dielectric layers have a difference in thickness, one of the dielectric layers that is disposed on or close to the first surface in position is greater in thickness than another one of the dielectric layers that is disposed on or close to the second surface in position, and wherein one of the dielectric layers that is closest to the first surface in position has a thickness greater than each of thicknesses of the others of the dielectric layers, and one of the dielectric layers that is closest to the second surface in position has a thickness less than each of thicknesses of the others of the dielectric layers; and
a chip mounted on a first surface of the packaging substrate.

22. The package structure of claim 21, wherein the dielectric layers, except the one that is closest to the first surface and the one that is closest to the second surface, have the same thickness.

23. The package structure of claim 19, wherein the thicknesses of the dielectric layers are progressively reduced from the first surface to the second surface.

24. The package structure of claim 19, wherein one half of the dielectric layers that are close to the first surface in position have a thickness sum greater than a thickness sum of the other half of the dielectric layers that are close to the second surface in position.

25. The package structure of claim 19, wherein a thickness ratio between a thickest one of the dielectric layers and a thinnest one of the dielectric layers is 1.2:1 to 2:1.

26. The package structure of claim 25, wherein a thickness ratio between the thickness one and the thinnest one is 1.5:1.

27. The package structure of claim 19, wherein a thickest one of the dielectric layers is thicker than a thinnest one of the dielectric layers by 10 to 50 μm.

28. The package structure of claim 27, wherein the thickest one is thicker than the thinnest one by 10 to 25 μm.

29. The package structure of claim 21, wherein a core layer is disposed therebetween, and the dielectric layers are symmetrically distributed on two opposing surfaces of the core layer by taking the core layer as a center.

30. The packaging substrate of claim 21, wherein the thicknesses of the dielectric layers are reduced progressively from the first surface to the second surface.

31. The packaging substrate of claim 21, wherein one half of the dielectric layers that are close to the first surface have a thickness sum greater than a thickness sum of the other half of the dielectric layers that are close to the second surface.

32. The packaging substrate of claim 21, wherein a thickness ratio between a thickest one of the dielectric layers and a thinnest one of the dielectric layers is 1.2:1 to 2:1.

33. The packaging substrate of claim 32, wherein a thickness ratio between the thickness one and the thinnest one is 1.5:1.

34. The packaging substrate of claim 21, wherein the thickest dielectric layer and the thinnest dielectric layer have a thickness difference of 10 to 50 µm.

35. The packaging substrate of claim 34, wherein the thickest dielectric layer and the thinnest dielectric layer have a thickness difference of 10 to 25 µm.

36. The packaging substrate of claim 21, wherein the number of the dielectric layers is an even or odd number.

* * * * *